(12) United States Patent
Moore et al.

(10) Patent No.: US 9,966,349 B2
(45) Date of Patent: *May 8, 2018

(54) SEMICONDUCTOR MEMORY DEVICE STRUCTURE

(71) Applicant: Ovonyx Memory Technology, LLC, Alexandria, VA (US)

(72) Inventors: John Moore, Boise, ID (US); Joseph F. Brooks, Boise, ID (US)

(73) Assignee: OVONYX MEMORY TECHNOLOGY, LLC, Alexandria, VA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/412,873

(22) Filed: Jan. 23, 2017

(65) Prior Publication Data

US 2017/0194275 A1    Jul. 6, 2017

Related U.S. Application Data

(60) Continuation of application No. 14/877,341, filed on Oct. 7, 2015, now Pat. No. 9,589,918, which is a division of application No. 14/534,668, filed on Nov. 6, 2014, now Pat. No. 9,177,927, which is a division of application No. 13/253,512, filed on Oct. 5, 2011, now Pat. No. 8,900,945, which is a continuation of (Continued)

(51) Int. Cl.
| | |
|---|---|
| *H01L 27/24* | (2006.01) |
| *H01L 23/00* | (2006.01) |
| *H01L 45/00* | (2006.01) |
| *H01L 21/768* | (2006.01) |

(52) U.S. Cl.
CPC ........ *H01L 24/06* (2013.01); *H01L 21/76802* (2013.01); *H01L 21/76877* (2013.01); *H01L 24/03* (2013.01); *H01L 27/2436* (2013.01); *H01L 27/2463* (2013.01); *H01L 45/06* (2013.01); *H01L 45/1233* (2013.01); *H01L 45/1253* (2013.01); *H01L 45/143* (2013.01); *H01L 45/1608* (2013.01); *H01L 2224/0311* (2013.01); *H01L 2224/05014* (2013.01); *H01L 2224/05147* (2013.01); *H01L 2224/05655* (2013.01); *H01L 2224/06131* (2013.01); *H01L 2224/06179* (2013.01); *H01L 2924/1443* (2013.01)

(58) Field of Classification Search
CPC ..... H01L 24/03; H01L 23/5226; H01L 27/24; H01L 24/05; H01L 23/53257; H01L 45/1675

See application file for complete search history.

(56) References Cited

U.S. PATENT DOCUMENTS

| | | |
|---|---|---|
| 6,825,564 B2 | 11/2004 | Gleason et al. |
| 6,946,347 B2 | 9/2005 | Gilton |

(Continued)

*Primary Examiner* — Dung Le
(74) *Attorney, Agent, or Firm* — Holland & Hart LLP (57) ABSTRACT

A semiconductor memory device and front-end method of fabricating nickel plated caps over bond pads used in a memory device. The method provides protection of the bond pads from an oxidizing atmosphere without exposing sensitive structures in the memory device to the copper during fabrication. In some examples, the method and device include one or more conductive and insulating layers formed over a substrate, and a plurality of memory cells over the conductive and insulating layers.

17 Claims, 6 Drawing Sheets

Related U.S. Application Data application No. 12/853,100, filed on Aug. 9, 2010, now Pat. No. 8,043,961, which is a division of application No. 12/219,836, filed on Jul. 29, 2008, now Pat. No. 7,795,093, which is a division of application No. 11/399,358, filed on Apr. 7, 2006, now Pat. No. 7,485,948, which is a division of application No. 10/902,569, filed on Jul. 30, 2004, now Pat. No. 7,226,857.

(56) References Cited

U.S. PATENT DOCUMENTS

| | | | |
|---|---|---|---|
| 7,485,948 B2 * | 2/2009 | Moore | H01L 24/03 257/621 |
| 7,795,093 B2 * | 9/2010 | Moore | H01L 24/03 438/257 |
| 2004/0036137 A1 | 2/2004 | Gleason et al. | |
| 2004/0232551 A1 | 11/2004 | Moore et al. | |
| 2005/0020069 A1 | 1/2005 | Gleason et al. | |
| 2005/0194255 A1 | 9/2005 | Tiwari | |
| 2006/0022352 A1 | 2/2006 | Moore et al. | |

* cited by examiner

SEMICONDUCTOR MEMORY DEVICE STRUCTURE

CROSS REFERENCES

The present application for Patent is a continuation of U.S. patent application Ser. No. 14/877,341 by Moore et al., entitled "A Memory Device Structure," filed Oct. 7, 2015 which is a divisional of U.S. patent application Ser. No. 14/534,668 by Moore et al., entitled "Method of Forming a Memory Device," filed Nov. 6, 2014 which is a divisional of U.S. patent application Ser. No. 13/253,512 by Moore et al., entitled "Method of Forming a Memory Device," filed Oct. 5, 2011 which is a continuation of U.S. patent application Ser. No. 12/853,100 by Moore et al., entitled "Method of Forming a Bond Pad," filed Aug. 9, 2010 which is a divisional of U.S. patent application Ser. No. 12/219,836 by Moore et al., entitled "Front-End Processing of Nickel Plated Bond Pads," filed Jul. 29, 2008 which is a divisional of U.S. patent application Ser. No. 11/399,358 by Moore et al., entitled "Front-End Processing of Nickel Plated Bond Pads," filed Apr. 7, 2006 which is a divisional of U.S. patent application Ser. No. 10/902,569 by Moore et al., entitled "Front-End Processing of Nickel Plated Bond Pads," filed Jul. 30, 2004, assigned to the assignee hereof, and each of which is expressly incorporated by reference in its entirety herein.

FIELD OF THE INVENTION

The present invention relates to the field of semiconductor devices and, in particular, to the formation of bond pads for memory and other integrated circuit devices.

BACKGROUND OF THE INVENTION

A well known semiconductor memory component is random access memory (RAM). RAM permits repeated read and write operations on memory elements. Typically, RAM devices are volatile, in that stored data is lost once the power source is disconnected or removed. Examples of RAM devices include dynamic random access memory (DRAM), synchronized dynamic random access memory (SDRAM) and static random access memory (SRAM). In addition, DRAMS and SDRAMS also typically store data in capacitors, which require periodic refreshing to maintain the stored data.

Recently, resistance variable memory elements, which include Programmable Conductive Random Access Memory (PCRAM) elements, have been investigated for suitability as semi-volatile and non-volatile random access memory devices. A typical PCRAM device is disclosed in U.S. Pat. No. 6,348,365, assigned to Micron Technology Inc. and incorporated herein by reference. In typical PCRAM devices, conductive material, such as silver, is moved into and out of a chalcogenide material to alter the cell resistance. Thus, the resistance of the chalcogenide material can be programmed to stable higher resistance and lower resistance states. The programmed lower resistance state can remain intact for an indefinite period, typically ranging from hours to weeks, after the voltage potentials are removed.

One aspect of fabricating PCRAM cells, which may also occur in fabrication of other integrated circuit devices, involves bond pads used for connecting a PCRAM memory device to external leads of an encapsulated integrated circuit package. Increasingly, bond pads are fanned of copper, rather than traditional aluminum, due to its superior conductivity and scalability. One drawback associated with copper, however, is that it oxidizes rapidly. Thus, leaving the copper bond pads exposed to die fabrication or packaging process steps where oxygen is present will lead to corrosion of the bond pad. Exposing copper bond pads to subsequent fabrication and/or packaging processes may also cause poisoning of a PCRAM memory cell, because copper ions may migrate from the bond pads and into an underlying chalcogenide glass layer, which changes the responsiveness of the glass to accept or expel other ions used for programming the cell. This, in turn, makes the cell unable to reliably switch between high and low resistance states. Therefore, it is important in the fabrication or packaging of PCRAM cells to limit the cells' copper bond pad exposure and particularly exposure to an oxygen-filled environment. Other integrated circuits using copper bond pads should also avoid exposure of the bond pad to oxidizing environments during subsequent fabrication and/or packaging steps.

One method for addressing this problem involves back-end processing where nickel is plated onto the copper bond pads after their fabrication. The back-end processing, however, may involve an ion mill etch step, which is a non-selective etching procedure, on the exposed copper. As copper etches at a higher rate than other materials used in fabrication, performing this etch could degrade the copper bond pad completely.

Accordingly, there is a need for a method of forming PCRAM cells where the PCRAM cell materials are not exposed to copper and the copper bond pads are not oxidized and do not corrode. There is also a more general need to protect copper bond pads from an oxidizing atmosphere during subsequent fabrication steps of integrated circuit devices.

BRIEF SUMMARY OF THE INVENTION

Exemplary embodiments of the invention provide a front-end method of fabricating nickel plated caps over copper bond pads used in a memory device. The method involves depositing an oxide layer over circuitry formed on a substrate, including array and periphery circuitry. Using a layer of photoresist over the oxide layer, a bond pad pattern is formed and etched in the periphery, exposing a fabricated copper bond pad. The photoresist is removed and nickel is selectively plated onto the exposed copper pad to form a cap over the copper. Following this, fabrication steps may occur which expose the in-fabrication structure to an oxidizing atmosphere without oxidizing the copper bond pads.

In accordance with one exemplary embodiment, the invention is used to construct bond pads for a PCRAM memory in which PCRAM cell material is deposited and formed into memory cells after the copper bonds are formed and nickel plated.

BRIEF DESCRIPTION OF THE DRAWINGS

The above-discussed and other features and advantages of the invention will be better understood from the following detailed description, which is provided in connection with the accompanying drawings, in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit.

The term "resistance variable material" is intended to include chalcogenide glasses, and chalcogenide glasses comprising a metal, such as silver. For instance the term "resistance variable material" includes silver doped chalcogenide glasses, silver-germanium-selenide glasses, and chalcogenide glass comprising a silver selenide layer.

The term "resistance variable memory element" is intended to include any memory element, including programmable conductor memory elements, semi-volatile memory elements, and non-volatile memory elements which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

Figure 1:
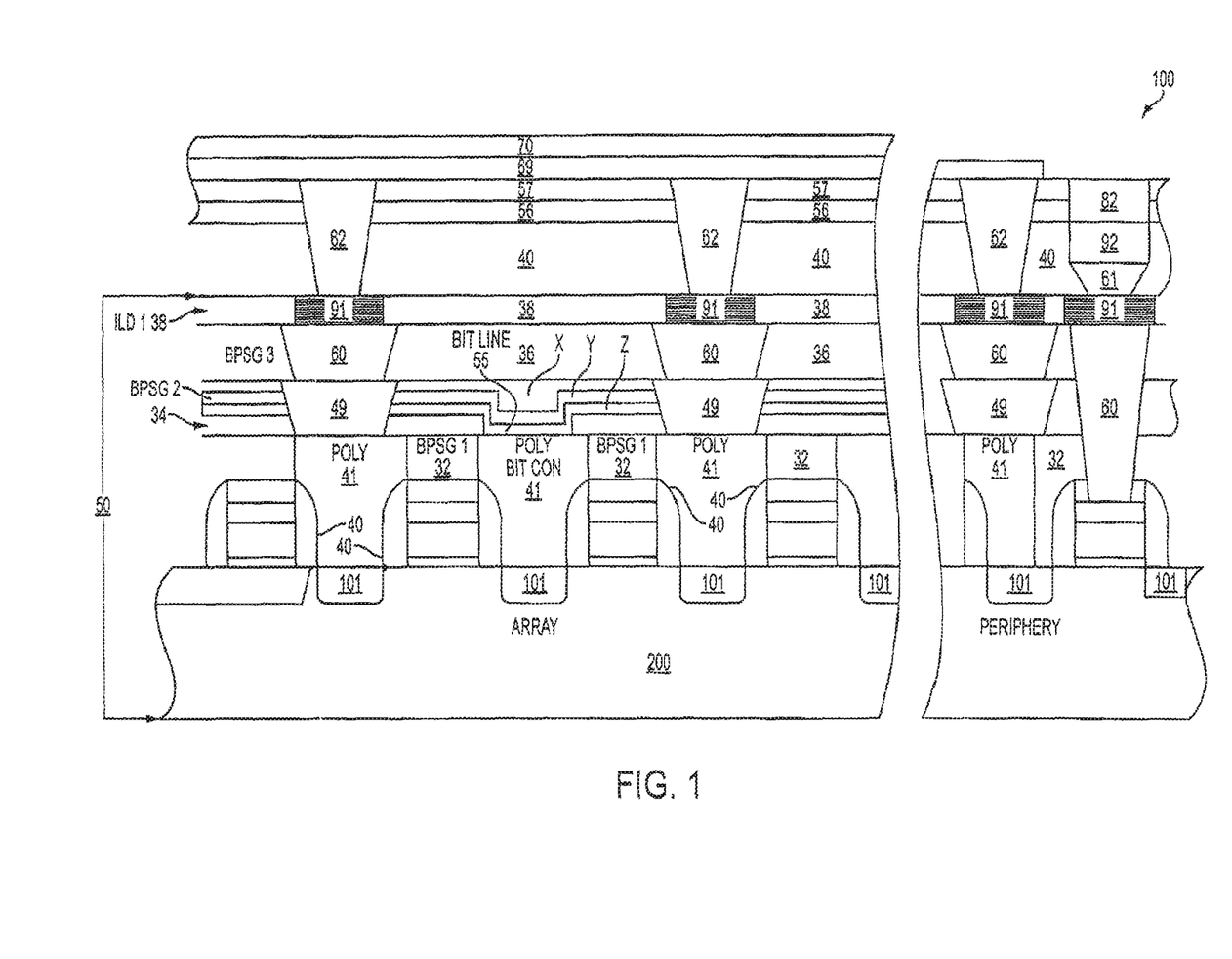
FIG. 1 is a cross-sectional view of an exemplary memory device constructed in accordance with the invention.

The invention is now explained with reference to the figures, which illustrate exemplary embodiments and where like reference numbers indicate like features. FIG. 1 shows array and peripheral circuitry portions of a resistance variable memory element 100 constructed in accordance with the invention. It should be understood that the portions shown are illustrative of one embodiment of the invention, and that the invention encompasses other devices that can be formed using different materials and processes than those described herein. The memory element 100 has copper bond pads 92 in the periphery which are covered with nickel plating 82. The pads 92, as discussed below, are constructed such that the memory cell material 69 in the array was not exposed to copper during fabrication of the device 100. Further, and as described in more detail below, the copper bond pad 92 was not exposed to an oxygen ambient during device 100 fabrication, which could have oxidized the copper and degraded the quality of the bond pad 92.

For exemplary purposes only, memory element 100 is shown with an example of the circuitry 50 that the copper bond pads 92 may be used in connection with. In the array and periphery portions of a substrate 200, transistors 40 are formed having source/drain active regions 101 in the substrate 200. A first insulating layer 32, e.g., a boro-phosphosilicate glass (BPSG) layer, is formed over the transistor gatestacks. Conductive plugs 41, which may be formed of polysilicon, are formed in the first insulating layer 32 connecting to the source drain regions 10 I in the substrate 200. A second insulating layer 34 is formed over the first insulating layer 32, and may again comprise a BPSG layer. Conductive plugs 49 are formed in the second insulating layer 34 and are electrically connected to the conductive plugs 4 I in the first insulating layer 32 which connects through some of plugs 41 to selected transistors 40. A conductive bit line 55 is formed between the conductive plugs 49 in the second insulating layer 34. The bit line illustrated has layers X, Y, Z formed of tungsten nitride, tungsten, and silicon nitride, respectively. A third insulating layer 36 is formed over the second insulating layer 34, and again openings in the insulating layer are formed and filled with a conductive material to form conductive plugs 60. Next, metallization layers having conductive traces and/or contacts 9 I are formed over the third insulating layer 36 and are insulated with an interlevel dielectric (ILD) layer 38.

Referring now to FIGS. 2-7, an exemplary method of forming the bond pads 92 for memory element 100 in accordance with the invention is now described. It should be understood that the description of materials and fabrication steps just described for circuitry 50 were illustrative only, and that other types of integrated circuitry is within the scope of the invention. Thus, for purposes of the remaining fabrication steps, the layers of the circuitry 50 are not depicted in the fabrication steps described with reference to FIGS. 2-7.

Figure 2:
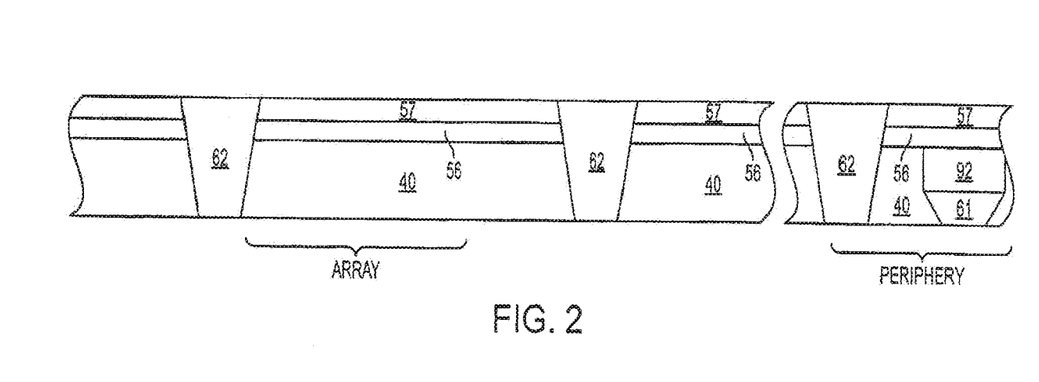
FIG. 2 is a cross-sectional view of a portion of the exemplary memory device of FIG. 1 during a stage of fabrication.

Turning to FIG. 2, an inter level dielectric (ILD) layer 40 is formed. In this layer 40 in the periphery, a dual damascene pattern is formed and filled with copper to create a copper connection 61 and a copper bond pad 92. In both the array and the periphery, an oxide layer 56 and a nitride layer 57 are then deposited over the ILD layer 40. Vias 62 are formed through layers 56, 57 and the ILD layer 40 and filled with a conductive material to connect with conductive areas of the circuitry 50 below (such as contacts 91 of FIG. 1). The vias 62 are filled with a conductive material, such as tungsten, and the vias 62 are either dry etched or chemical mechanical polished (CMP) to planarize the top of the vias 62 even with the nitride layer 57. Thus, at this stage, tungsten is exposed at the top of the vias 62 and the copper bond pad is covered with oxide layer 56 and nitride layer 57.

Figure 3:
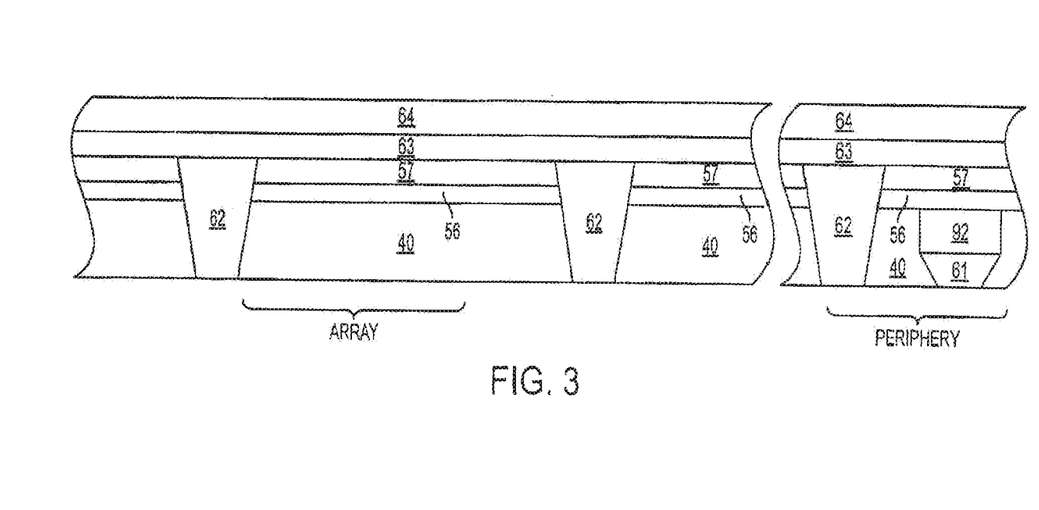
FIG. 3 is a cross-sectional view of a portion of the exemplary memory device of FIG. 1 during a stage of fabrication subsequent to that shown in FIG. 2.
Figure 4:
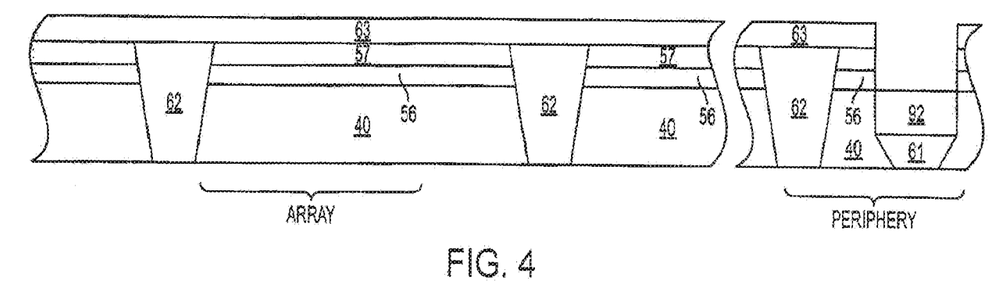
FIG. 4 is a cross-sectional view of a portion of the exemplary memory device of FIG. 1 during a stage of fabrication subsequent to that shown in FIG. 3.

Next, referring to FIG. 3, an oxide layer 63 is formed over the tops of the vias 62 and the nitride layer 57. The oxide layer 63 is preferably thin, approximately 100 to about 500 Angstroms thick over both the array and the periphery. A layer of photoresist 64 is formed over the oxide layer 63. As shown in FIG. 3, a bond pad pattern is formed over pad 92 by patterning and developing the photoresist 64, and as shown in FIG. 4, the opening is used to etch oxide layer 63, nitride layer 57, and oxide layer 56 down to the bond pad 92. After etching, the photoresist 64 is stripped from the wafer.

Figure 5:
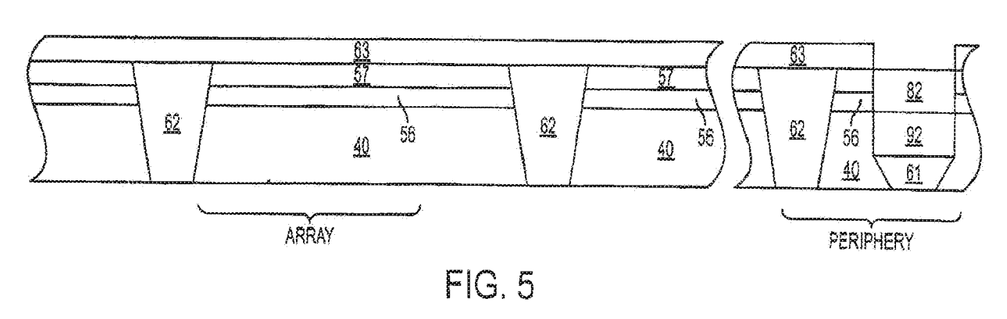
FIG. 5 is a cross-sectional view of a portion of the exemplary memory device of FIG. 1 during a stage of fabrication subsequent to that shown in FIG. 4.

At this stage in fabrication, in the area of the periphery where the bond pad is patterned, the exposed copper 92 will oxidize slightly, however, so long as the this step is not prolonged, the oxidation will enable the next formation step. As shown in FIG. 5, nickel is plated selectively onto the copper bond pad 92, forming a nickel cap 82. The nickel plating may be accomplished by an electroless nickel bath. For example, without limiting the plating chemistry that may be utilized for this invention, the copper bond pad 92 is exposed to a plating nickel bath having a pH value of approximately 8. The nickel bath may comprise a nickel salt and a reducing agent as well as a stabilizing agent. The temperature of the bath may be approximately 80 degrees Celsius or less, depending on the rate of deposition desired. A lower temperature improves the uniformity of deposition while a higher temperature increases the plating rate. The nickel cap may be approximately 4000 Angstroms thick. Post-plating, the remaining oxide layer 63 is wet etched off, leaving the tungsten vias 62 exposed.

Figure 6:
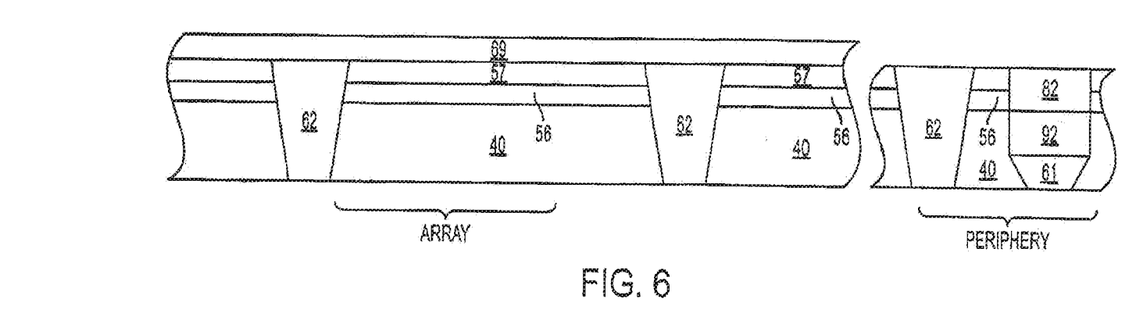
FIG. 6 is a cross-sectional view of a portion of the exemplary memory device of FIG. 1 during a stage of fabrication subsequent to that shown in FIG. 5.
Figure 7:
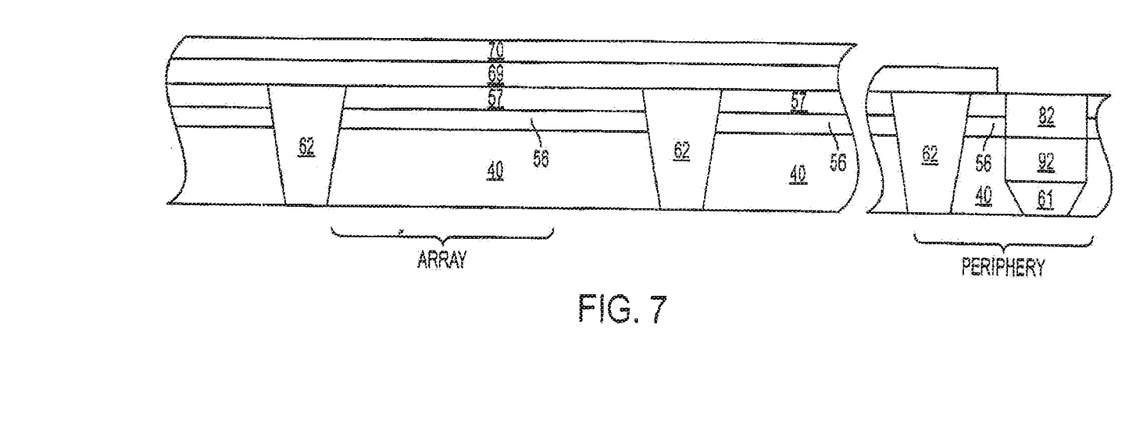
FIG. 7 is a cross-sectional view of a portion of the exemplary memory device of FIG. 1 during a stage of fabrication subsequent to that shown in FIG. 6.

Memory cell formation and patterning can now occur. As shown in FIG. 6, cell material 69 is deposited on the array. The cell material 69 may include resistance variable cell material, like the materials necessary for construction of PCRAM memory cells constructed according to the teachings of U.S. Pub. Appl. Nos. 2003/0155589 and 2003/0045054, each assigned to Micron Technology Inc. Appropriate PCRAM cell materials include layers of germanium selenide, chalcogenide glass, and silver-containing layers creating a resistance variable memory device 100. Finally, a top electrode 70 is deposited over the cell material 69 as shown in FIG. 7. The top electrode 70 contacts the cell 69 and the periphery vias 62. The electrode 70 can be patterned as desired. For example, the electrode 70 layer may be blanket deposited over the array; or alternatively, an electrode 70 may be deposited in a pre-determined pattern, such as in stripes over the array. In the case of PCRAM cells, the top electrode 70 should be a conductive material, such as tungsten or tantalum, but preferably not containing silver. Also, the top electrode 70 may comprise more than one layer of conductive material if desired.

At this stage, the memory element 100 is essentially complete. The memory cells are defined by the areas of layer 69 located between the conductive plugs 62 and the electrode 70. Other fabrication steps to insulate the electrode 70 using techniques known in the art, are now performed to complete fabrication.

Figure 8:
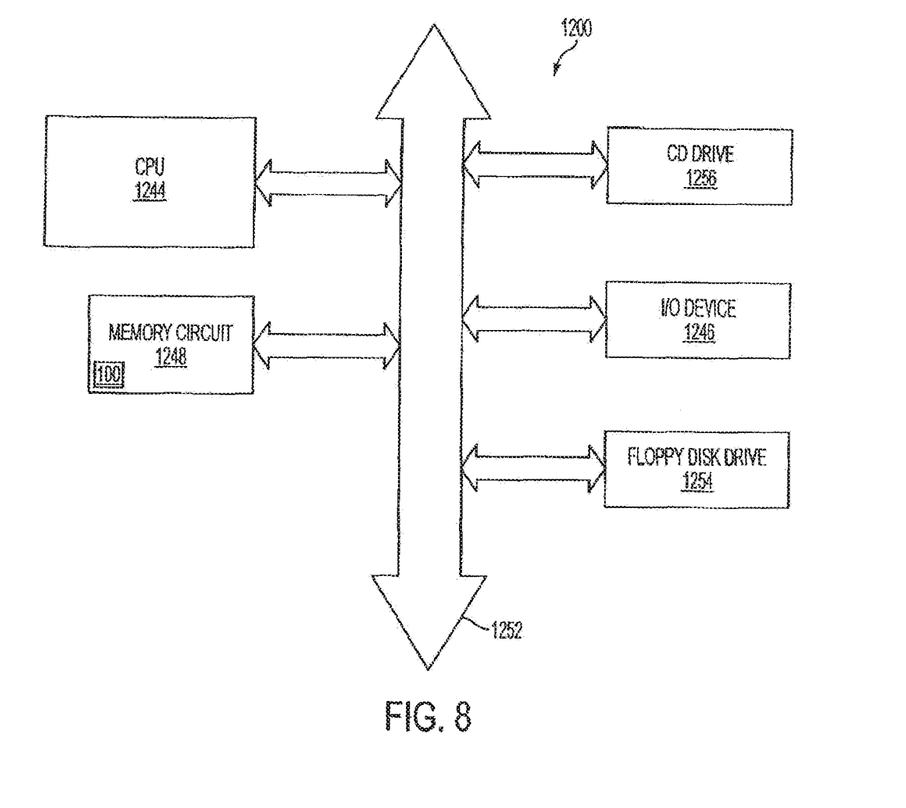
FIG. 8 illustrates a computer system having a memory element in accordance with the invention.
Figure 9:
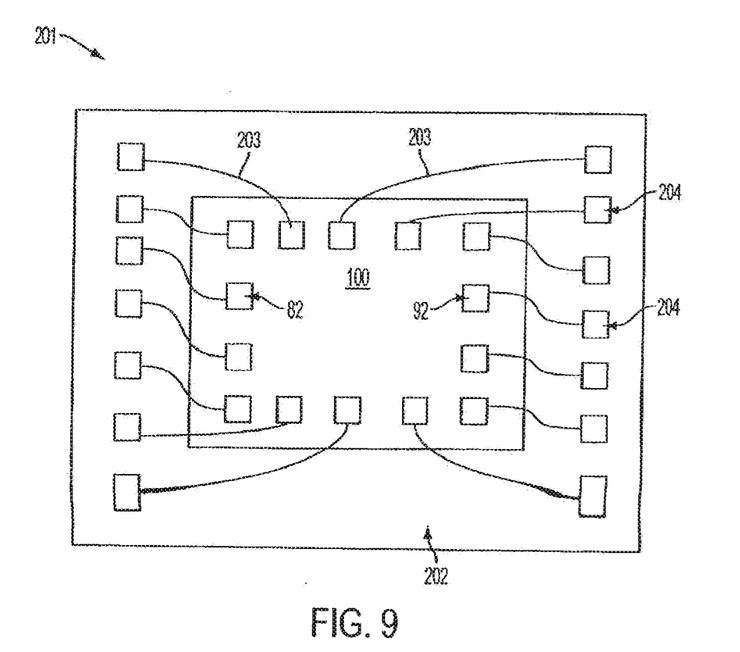
FIG. 9 illustrates an integrated circuit package having a memory element in accordance with the invention.

FIG. 9 illustrates that the memory element 100 is subsequently used to form an integrated circuit package 201 for a memory circuit 1248 (FIG. 8). The memory device 100 is physically mounted on a mounting substrate 202 using a suitable attachment material. Bond wires 203 are used to provide electrical connection between the integrated chip bond pads 92 and the mounting substrate bond pads 204 and/or lead wires which connect the die 100 to circuitry external of package 201.

The embodiments described above refer to the formation of a memory device 100 structure in accordance with the invention. It must be understood, however, that the invention contemplates the formation of other integrated circuit elements, and the invention is not limited to the embodiments described above. Moreover, although described as a single memory device 100, the device 100 can be fabricated as a part of a memory array and operated with memory element access circuits.

FIG. 8 is a block diagram of a processor-based system 1200, which includes a memory circuit 1248, for example a PCRAM circuit employing non-volatile memory devices 100 fabricated in accordance with the invention. The processor system 1200, such as a computer system, generally comprises a central processing unit (CPU) 1244, such as a microprocessor, a digital signal processor, or other programmable digital logic devices, which communicates with an input/output (I/O) device 1246 over a bus 1252. The memory 1248 communicates with the system over bus 1252 typically through a memory controller.

In the case of a computer system, the processor system may include peripheral devices such as a floppy disk drive 1254 and a compact disc (CD) ROM drive 1256, which also communicate with CPU 1244 over the bus 1252. Memory 1248 is preferably constructed as an integrated circuit, which includes one or more resistance variable memory elements 100. If desired, the memory 1248 may be combined with the processor, for example CPU 1244, in a single integrated circuit.

The above description and drawings are only to be considered illustrative of exemplary embodiments which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

The invention claimed is:

1. An integrated circuit, comprising:
   a memory device including a plurality of transistors;
   a conductive bond pad over the plurality of transistors;
   a first insulating layer over the conductive bond pad;
   a second insulating layer over the first insulating layer;
   a substrate in electronic communication with the conductive bond pad via a bond wire; and
   an array of memory cells over the second insulating layer, the array of memory cells in electronic communication with the substrate via a lead wire.

2. The integrated circuit of claim 1, further comprising:
   an electrode layer formed over the array of memory cells, wherein the electrode layer comprises tungsten, tantalum, or a combination thereof.

3. The integrated circuit of claim 1, wherein one of the memory cells comprises a resistance variable cell material.

4. The integrated circuit of claim 1, further comprising:
   a plurality of conductive traces in the second insulating layer, wherein the plurality of conductive traces are insulated by an interlevel dielectric (ILD) layer.

5. The integrated circuit of claim 4, further comprising:
   a plurality of vias through the ILD layer, wherein each of the plurality of vias is filled with a conductive material that is in electronic communication with one of the plurality of transistors.

6. The integrated circuit of claim 4, further comprising:
   a first oxide layer over the ILD layer; and
   a nitride layer over the first oxide layer.

7. The integrated circuit of claim 6, further comprising:
   a photoresist layer over the first oxide layer.

8. The integrated circuit of claim 7, further comprising:
   a layer of resistance variable cell material over the photoresist layer; and
   an electrode layer over the layer of resistance variable cell material, wherein the electrode layer comprises a plurality of layers of conductive material.

9. The integrated circuit of claim 1, wherein the substrate comprises a semiconductor material.

10. A method, comprising:
forming a plurality of transistors in contact with a substrate;
forming a first conductive layer over the plurality of transistors;
forming a first insulating layer over the first conductive layer;
forming a second insulating layer over the first insulating layer; and
forming a plurality of memory cells over the second insulating layer.

11. The method of claim 10, further comprising:
forming a conductive bond pad in the first conductive layer, wherein the conductive bond pad is in electronic communication with the plurality of transistors.

12. The method of claim 10, further comprising:
forming a plurality of conductive traces in the second insulating layer, wherein the plurality of conductive traces are insulated by an interlevel dielectric (ILD) layer.

13. The method of claim 12, further comprising:
forming a plurality of vias through the ILD layer, wherein each of the plurality of vias is filled with a conductive material that is in electronic communication with one of the plurality of transistors.

14. The method of claim 12, further comprising:
forming a first oxide layer over the ILD layer; and
forming a nitride layer over the first oxide layer.

15. The method of claim 14, further comprising:
forming a photoresist layer over the first oxide layer.

16. The method of claim 15, further comprising:
forming a layer of resistance variable cell material over the photoresist layer; and
forming an electrode layer over the layer of resistance variable cell material, wherein the electrode layer comprises a plurality of layers of conductive material.

17. The method of claim 10, wherein the substrate comprises a semiconductor material.

* * * * *